(12) United States Patent
Kuzmenka (10) Patent No.: US 7,035,116 B2
(45) Date of Patent: Apr. 25, 2006

(54) MEMORY SYSTEM AND MEMORY SUBSYSTEM

(75) Inventor: Maksim Kuzmenka, Munich (DE)

(73) Assignee: Infineon Technologies AG, Munich (DE)

( * ) Notice: Subject to any disclaimer, the term of this patent is extended or adjusted under 35 U.S.C. 154(b) by 198 days.

(21) Appl. No.: 10/715,145

(22) Filed: Nov. 17, 2003

(65) Prior Publication Data
US 2004/0125635 A1   Jul. 1, 2004

(30) Foreign Application Priority Data
Nov. 21, 2002   (EP) ................... 02026015

(51) Int. Cl.
*H01R 12/16*   (2006.01)
*H05K 1/11*   (2006.01)
*G06F 1/16*   (2006.01)
(52) U.S. Cl. ............... 361/789; 361/748; 361/784; 361/776; 361/684
(58) Field of Classification Search ............... 361/749; 365/63; 710/305
See application file for complete search history.

(56) References Cited

U.S. PATENT DOCUMENTS

| 5,355,105 A | * | 10/1994 | Angelucci, Sr. ............ 333/238 |
| 6,483,713 B1 | * | 11/2002 | Samant et al. ............... 361/749 |
| 6,614,664 B1 | * | 9/2003 | Lee ........................... 361/784 |
| 6,721,189 B1 | * | 4/2004 | Haba ........................ 361/792 |
| 2002/0048157 A1 | | 4/2002 | Lee | |
| 2002/0159284 A1 | * | 10/2002 | Funaba et al. ............... 365/63 |

FOREIGN PATENT DOCUMENTS

JP   2250388   10/1990

* cited by examiner

*Primary Examiner*—Rehana Perveen
*Assistant Examiner*—Matthew Spittle
(74) *Attorney, Agent, or Firm*—Slater & Matsil, L.L.P.

(57) ABSTRACT

A memory system has a circuit board provided with a first slot connector into which a first memory module is inserted. A second slot connector is provided into which a second memory module is inserted. The first and the second memory modules are connected via a flexible bridge. The flexible bridge extends from respective ends of the memory modules opposite to that ends thereof which are inserted into the connector slots. The flexible bridge provides a signal bus between the memory modules.

19 Claims, 13 Drawing Sheets

MEMORY SYSTEM AND MEMORY SUBSYSTEM

BACKGROUND OF THE INVENTION

1. Field of the Invention

The present invention relates to a memory system, and, in particular, to a memory system having an improved data bus topology and/or control signal topology. Moreover, the present invention relates to a memory subsystem for such a memory system.

2. Description of Prior Art

One conventional memory system which is implemented nowadays in a wide spread manner is the DDR1 memory subsystem.

In a DDR1 memory subsystem, a memory controller and a number of slots are arranged on a memory board. The slots are for receiving connectors of DDR DRAM modules. The DDR DRAM modules include a module board and respective memory chips arranged on the module board. Signal buses are provided for transferring signals between the memory chips and the controller, i.e. for transferring clock signals, data signals and control signals therebetween. The control signals are typically C/A signals (C/A=command/address).

In the following, bus topologies of the DDR1 memory subsystem and of the successor thereof, i.e. the DDR2 memory subsystem, are set out making reference to FIG. 11 to 13a.

Figure 11:
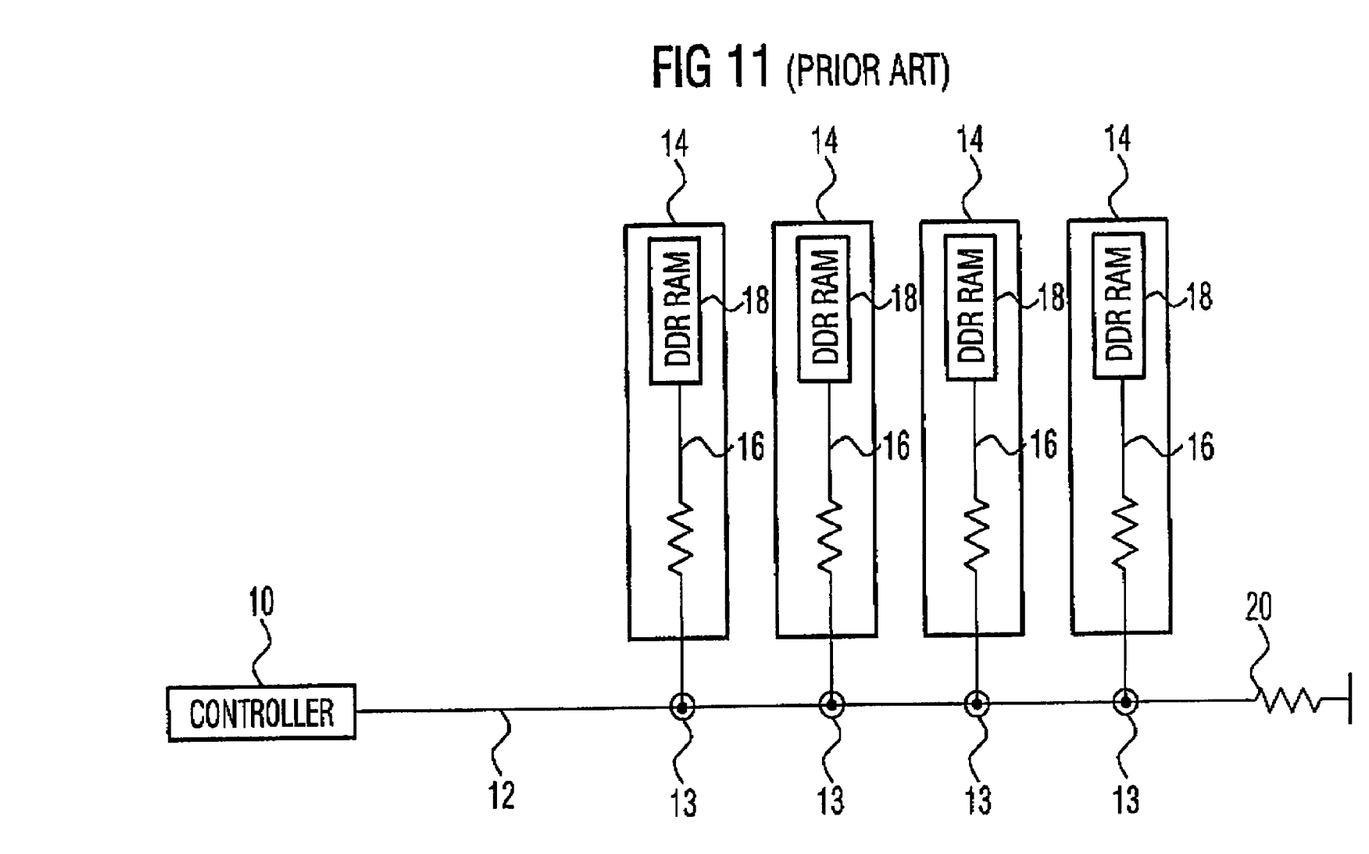
FIG. 11 shows an existing data bus topology.

FIG. 11 schematically shows the data bus topology of the DDR1/DDR2 memory subsystem. A memory controller 10 is arranged on a circuit board (not shown) of the memory subsystem. A data bus 12 is arranged on the circuit board and connected to the controller 10. In addition, the data bus 12 is connected to slot connectors 13 having respective slots for receiving DDR1/DDR2 memory modules 14. On the modules 14, i.e. the module board thereof, respective data lines 16 are arranged which connect DDR DRAM chips 18 arranged on the module boards to the data bus 12. Moreover, the data bus 12 is connected to a reference potential via a termination resistor 20 at the end opposite to the memory controller 10.

Thus, in existing DDR1/DDR2 memory subsystems, the data bus topology includes a linear data bus 12 on the circuit board (or motherboard) of the memory system and stub buses 16 to the memory chips 18 arranged on the memory modules 14.

Figure 12A:
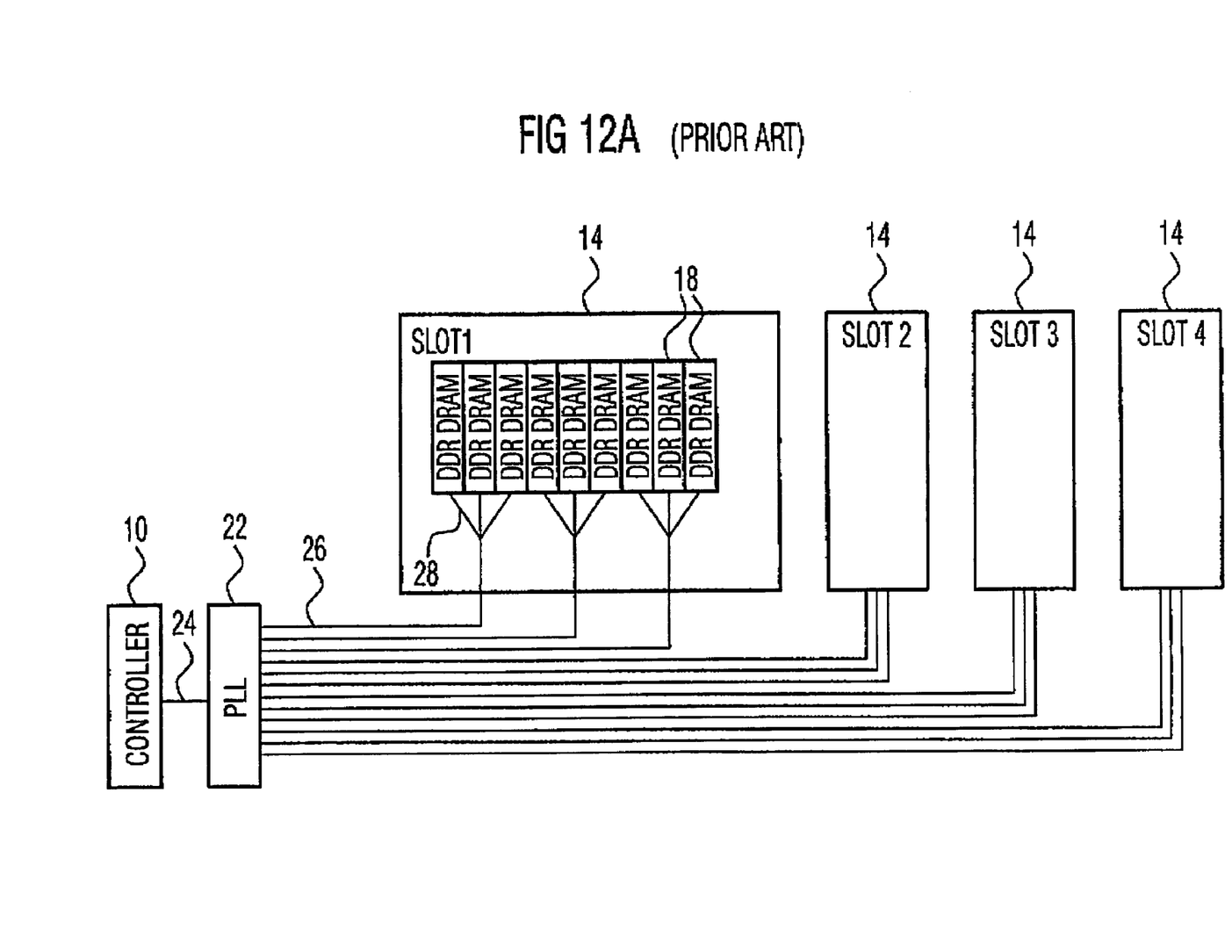
FIGS. 12a and 12b show existing clock bus topologies.

A unbuffered clock topology for DDR1/DDR2 memory systems is shown in FIG. 12a. For sake of simplicity, differential traces are shown like single ended once in FIG. 12a. As can be seen in FIG. 12a, the controller 10 is connected to a phase locked loop 22 (PLL) via a clock line 24. The phase locked loop 22 generates clock signals on a plurality of twelve clock sublines 26. Respectively, three clock sublines 26 are connected to each of the memory modules 14, which are received in slots 1 to 4 as it is indicated in FIG. 12a. In FIG. 12a, the memory module inserted into slot 1 is shown as having nine DDR DRAM chips 18. The memory modules inserted in slots 2 to 4 are not drawn to this detail. Moreover, each clock subline 26 branches into three clock sub-sublines 28 each of which is connected to a respective memory chip 18. PLL feedback traces are not shown in the figures. Although four modules for the unbuffered clock topology are shown in FIG. 9a, usually no more than three modules are used in PC desktop systems.

In the clock bus topology shown in FIG. 12a, one part of the clock sublines 26 is formed on the memory board and one part thereof is formed on the module board. Both parts are connected via the slot connector into which the memory module is inserted. The clock sub-sublines 28 are formed on the memory boards. In the unbuffered clock topology shown in FIG. 12a, clock signals must be simultaneously delivered to all DRAM chips.

Figure 12B:
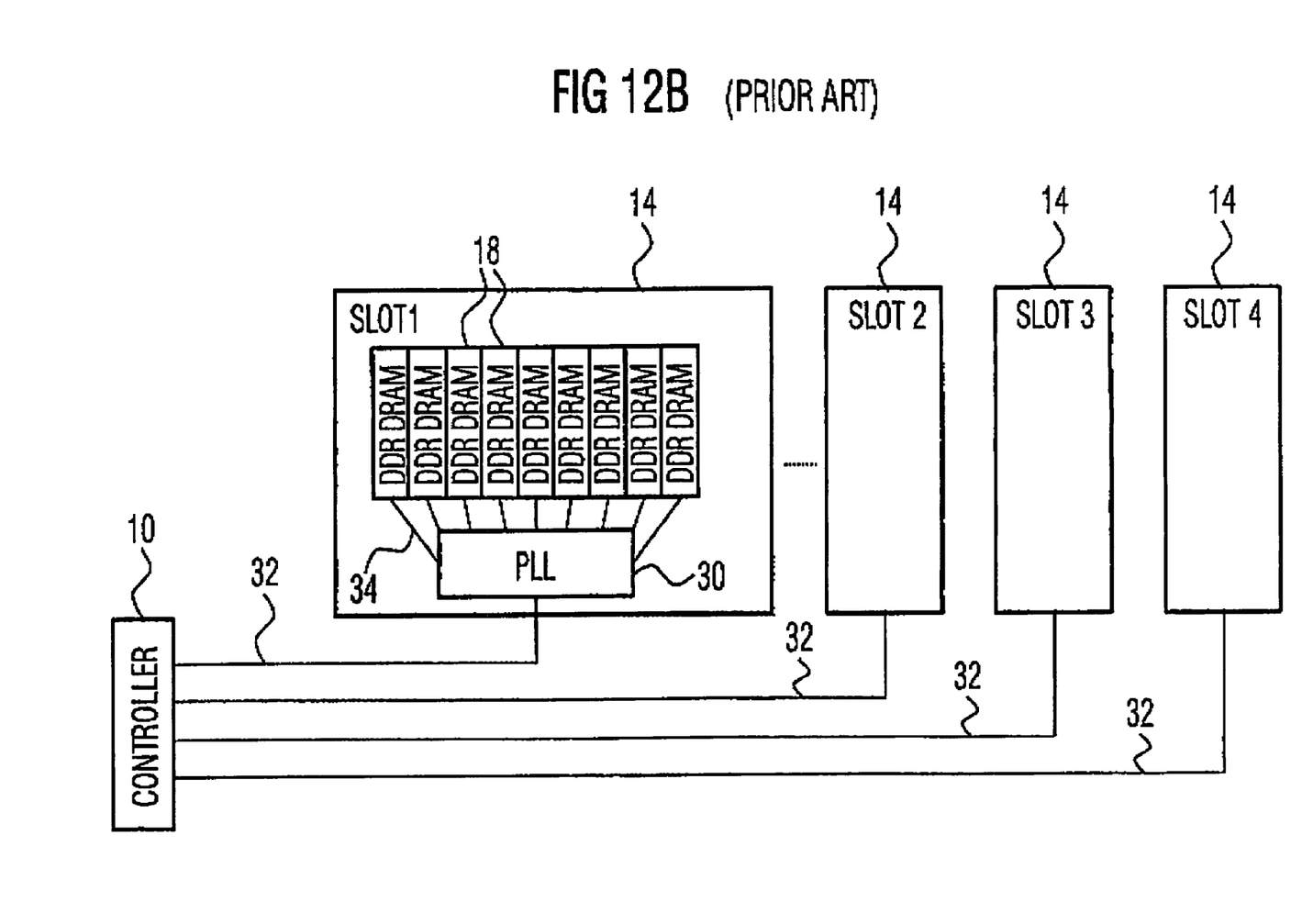

A registered clock topology for DDR1/DDR2 memory systems is shown in FIG. 12b.

In this topology, a phase locked loop 30 is provided on the respective memory modules 14. The memory controller 10 is connected to the phase locked loops 30 of the memory modules 14 by a respective clock line 32. The phase locked loop 30 comprises a number of output lines 34 corresponding to the number of memory chips 18. In the clock topology shown in FIG. 12b, runtime differences due to different lengths of the clock lines 32 can be equalized by the phase locked loops 30.

Figure 13A:
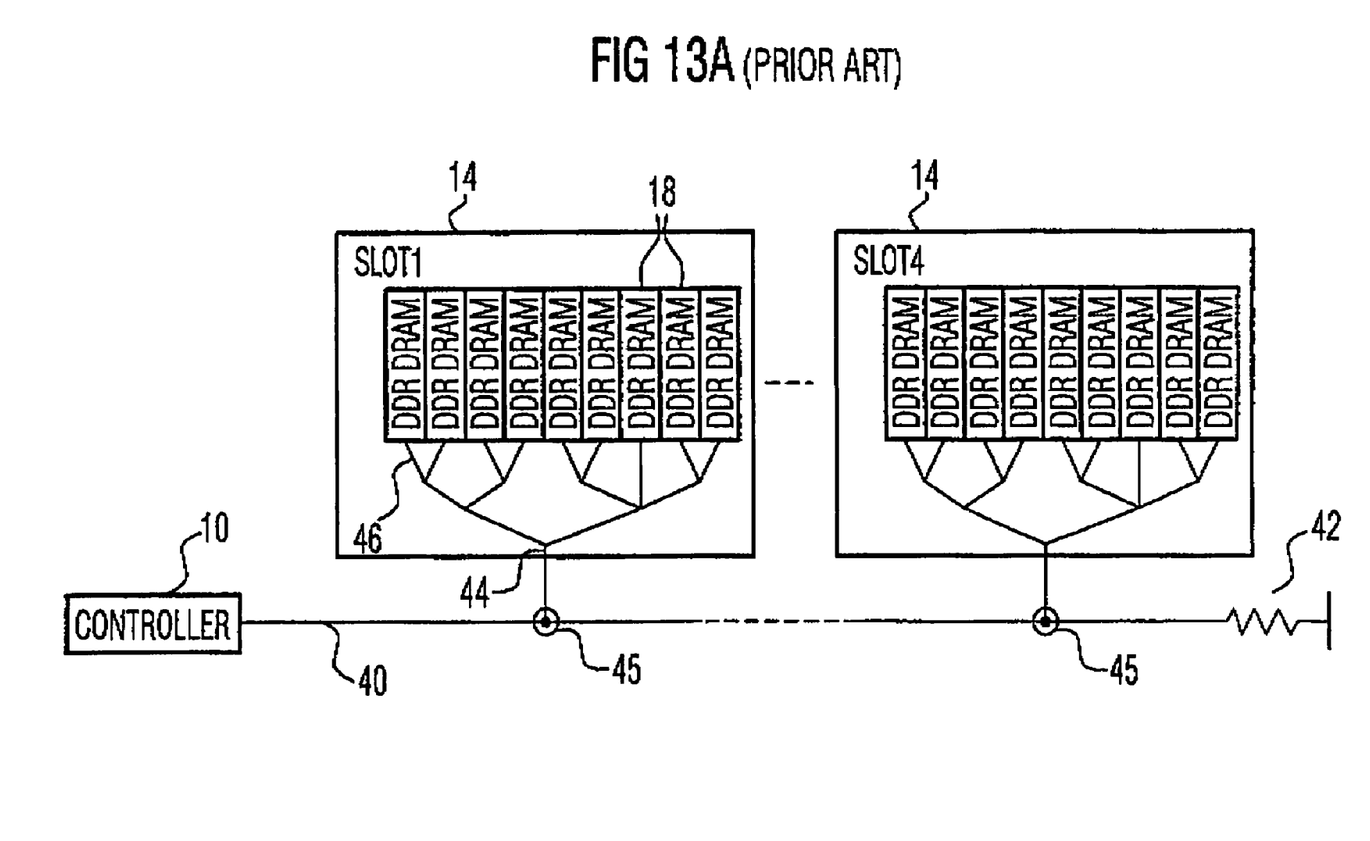
FIGS. 13a and 13b show existing C/A bus topologies.
Figure 13B:
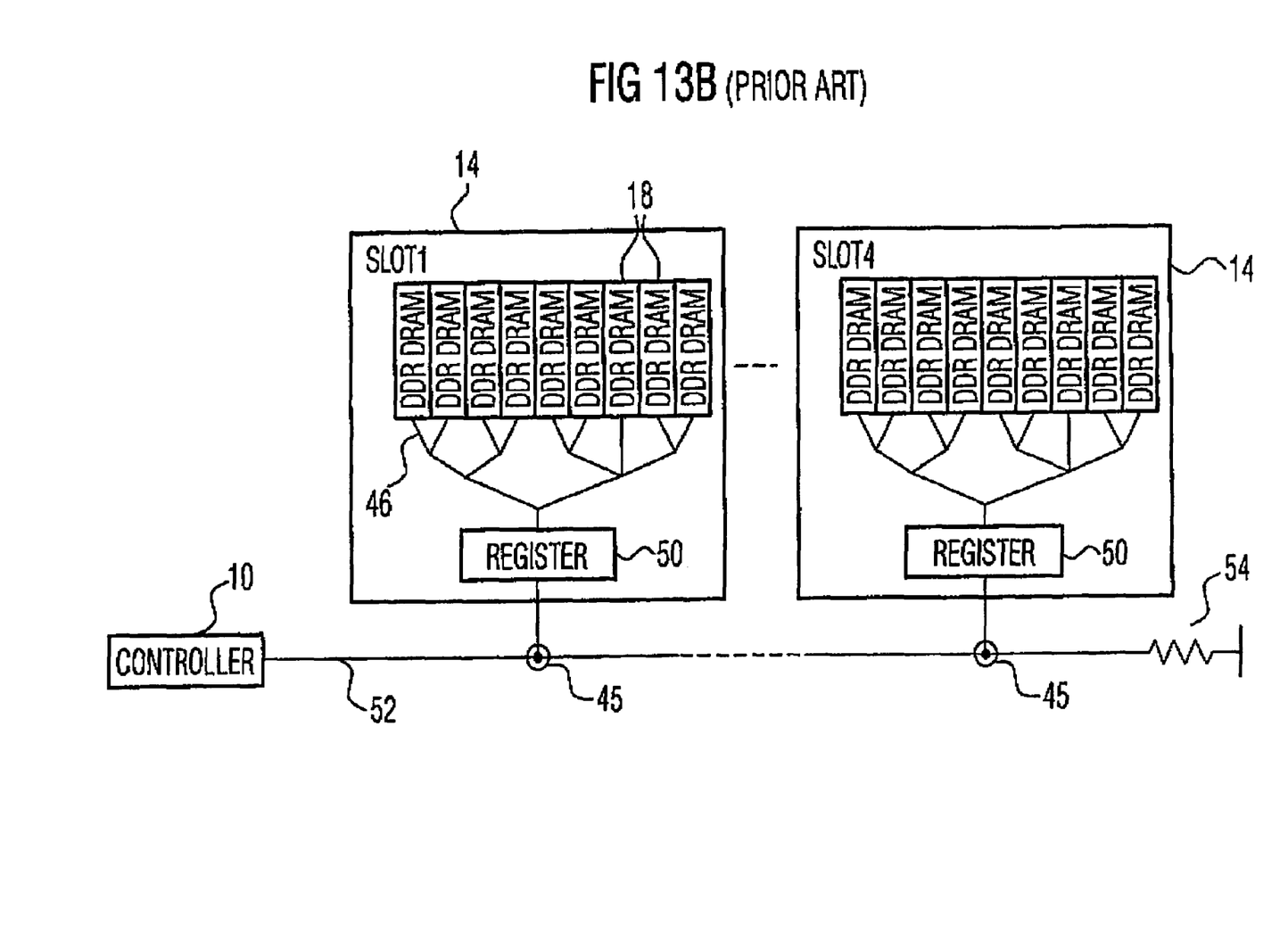

An unbuffered bus topology for C/A buses of the DDR1/DDR2 memory system is shown in FIG. 13a, whereas a registered bus topology for the C/A buses of a DDR1/DDR2 memory system is shown in FIG. 13b.

In the unbuffered C/A bus topology, a C/A bus 40 is provided on the memory circuit board and connected to a reference potential by a termination resistor 42. A common C/A bus portion 44 of the respective memory modules 14 is connected to the C/A bus 40 via respective slot connectors 45. The common C/A bus portion 44 branches in C/A subbuses 46 each of which is connected to a respective DDR DRAM chip 18. In FIG. 13a, only one address line of the C/A bus topology is shown, whereas, in reality, a plurality of 21 to 27 address lines may be provided.

In the registered C/A bus topology shown in FIG. 13b, each of the memory modules 14 comprises a register 50 which is connected to a C/A bus 52 on the memory circuit board via the slot connectors 45. Again, the C/A bus 52 is connected to a reference potential via a termination resistor 54 at the end opposite to the memory controller 10.

The inventors have recognized that the signal quality in a DDR2 system having four slots and operating at a data rate of 533 Mb/s is not acceptable in case of using a data bus topology like in a DDR1 memory subsystem shown above making reference to FIG. 11.

SUMMARY OF THE INVENTION

It is the object of the present invention to provide a memory system permitting an improved signal quality at high data rates and to provide a memory subsystem and a memory module which can be used in such a memory system.

In accordance with a first aspect of the invention, this object is achieved by a memory system comprising: a circuit board having a first means for receiving and a second means for receiving; a first memory module received in the first means for receiving; a second memory module received in the second means for receiving; and a flexible bridge connecting the first and second memory modules for providing a signal bus between the memory modules.

In accordance with a second aspect of the invention, this object is achieved by a memory subsystem comprising: a first memory module, a second memory module, and a flexible bridge connecting the first and the second memory modules and providing a signal path therebetween.

The present invention is based on the recognition that the usage of a flexible bridge for a signal bus between two modules allows to connect all memory modules, and, thus, all memory chips on the memory modules, without stubs, and, therefore, to make signal quality better. Such a stubless topology can be referred to as SLT topology (SLT=short loop through) in view of the fact that all memory modules are connected in one loop.

Thus, in preferred embodiments of the present invention, the signal bus between the memory modules which is implemented as a flexible bridge is a data bus so that the quality of the signals transferred over the data bus can be improved.

In preferred embodiments of the present invention, the first and second means for receiving are slot connectors provided on the circuit board of the memory system and the memory modules comprise memory module boards inserted into the slot connectors so that the memory module boards are oriented substantially perpendicular to the memory system circuit board and so that electrical connections are achieved between respective signal lines on the memory system circuit board and the memory module board. In such case, the flexible bridge, in the form of a flexible PCB (PCB=printed circuit board), for example, is connected at the end of the memory module board opposite to the end inserted into the slot connector. Signal lines on the flexible bridge are connected to respective signal lines on the memory module board, so that a signal bus connecting the memory modules is obtained. Preferably, the signal bus includes a data bus, but also may include a control signal bus and/or a clock bus. To be more specific, in a preferred embodiment of the present invention, the data bus between specific memory modules is implemented via the flexible bridge whereas the clock bus topology and the control signal bus topology correspond to the conventional DDR1/DDR2 memory system topologies.

If, in a four slot system, memory modules are inserted into each slot, according to the present invention, a data bus between a memory controller and a first memory module is routed over the memory system circuit board, a data bus between the first memory module and a second adjacent memory module is implemented via a flexible bridge, a data bus between the second memory module and a third memory module is routed over the memory system circuit board, a data bus between the third memory module and an adjacent fourth memory module is implemented via a flexible bridge, and a data bus between the fourth memory module and a termination resistor located on the memory system circuit board is routed over the memory system circuit board. By this arrangement, all memory chips on the memory modules can be connected by the data bus without stubs.

In case a four slot memory system is populated by two memory modules only, the first module is to be inserted into the first slot while the second module is to be inserted into the fourth slot. Then, the data bus between the first and second modules can be implemented making use of a flexible bridge so that a continuous data bus between the memory controller and the termination resistor is realized.

Making use of the present invention in a memory system having dimensions comparable to those of DDR2 4 slot memory system, a good signal quality at 533 Mb/s can be achieved, while the conventional topology shown in FIG. 11 does not show an acceptable performance at such a data rate. In the present invention, conventional DDR2 chips can be used without changes being necessary thereto. Moreover, it is possible to use the standard for the connector pinout of 2 slot systems and DIMM dimensions (DIMM=dual inline memory module). The present invention is not restricted to a 4 slot topology indicated above. Rather, the number of slots can be increased to six or higher, and correspondingly the number of "pairs" of memory modules connected via the flexible bridge can be increased to three or higher, so that high density systems can be obtained. According to the invention, it is possible to use existing 240 pin slot connectors. Moreover, the present invention renders superfluous usage of any stub resistors on the data bus.

BRIEF DESCRIPTION OF THE DRAWINGS

Preferred embodiments of the present invention are described hereinafter making reference to the enclosed drawings, in which.

DESCRIPTION OF PREFERRED EMBODIMENTS

The embodiment of a memory system according to the invention shown in FIG. 1 comprises a memory circuit board 100 which is named motherboard in the following. A memory controller 102, a first slot connector 104, a second slot connector 106, a third slot connector 108, a fourth slot connector 110 and a termination resistor 170 are arranged on the motherboard 100. First, second, third and fourth memory modules 114, 116, 118 and 120 are inserted into the first to fourth slot connectors 104, 106, 108 and 110. Each of the memory modules includes a number of memory chips 130 arranged on a respective memory module board 132.

Figure 1:
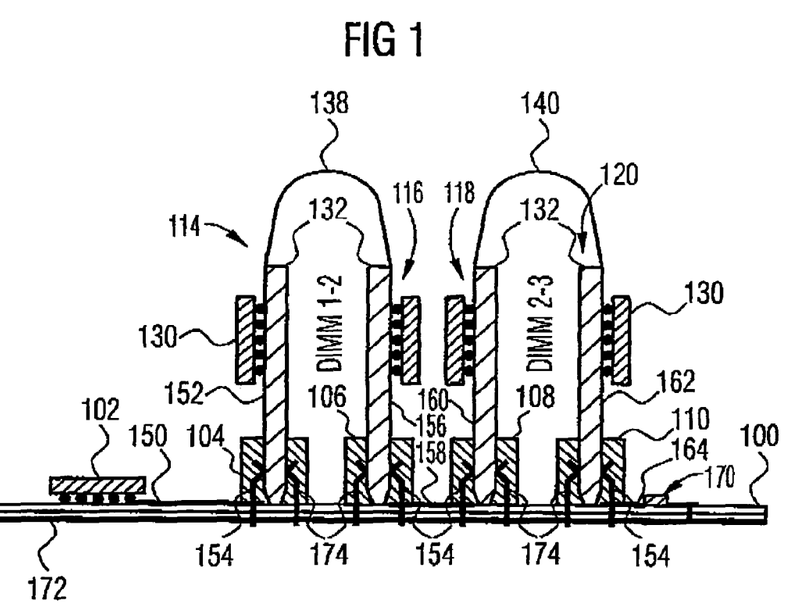
FIG. 1 shows a schematic side view of an embodiment of an inventive memory system.

As can be seen in FIG. 1, a flexible bridge 138 is provided between the first and second memory modules 114, 116, and a flexible bridge 140 is provided between the third and fourth memory modules 118, 120. The flexible bridge is preferably formed by a flexible printed circuit board having two conductive layers, a reference potential layer and a signal layer, and at least one isolating layer isolating the conductive layers from each other. The isolating layer may be formed of any suitable material providing the desired flexibility, a polymer material, for example. In addition, the flexible bridge may be provided with further isolating layers and protective layers.

In the following, the data path and, therefore, the data bus of the memory system shown in FIG. 1 is explained in detail.

A first portion of the data path is provided by a data bus portion 150 provided on the motherboard 100 between the memory controller 102 and the first slot connector 104. A second portion of the data path is provided by data lines 152 formed on the memory module board 132 of the first memory module 114. The memory chips of this memory module also are connected to the data lines 152. The data lines 152 on the memory module board are connected to the first data bus portion 150 by electrical connectors 154 of the slot connector 104, wherein the slot connector and the electrical connectors can be of a conventional construction.

The datea lines 152 on the memory module board 132 exted from the lower end thereof (at which they are connected by the electrical connectors 154 to the data bus portion 150) to the upper end of the memory module board at which same are connected to respective data lines on the flexible bridge 138 so that the flexible bridge 138 forms a third data bus portion. A fourth data bus portion 156 is formed by data lines on the memory module board of the second memory module 116, and a fifth data bus portion 158 is formed by data lines located on the motherboard 100 and providing electrical connection between the slot connectors 106 and 108. A sixth data bus portion 160 is formed by data lines on the memory module board of the third memory module 118, a seventh data bus portion is formed by the flexible bridge 140, an eighth data bus portion is formed by data lines 162 on the memory module board of the fourth memory module 120, and a ninth data bus portion 164 is formed by data lines on the motherboard 100 connecting the electrical connectors 154 of the fourth slot connector 110 to a first ends of a termination resistor 170. The second end of the termination resistor 170 is connected to a reference potentional plane 172 of the motherboard 100.

The flexible bridges 138 and 140 can be implemented as separate flexible printed circuit boards wherein respective pads thereof are soldered to associated pads of the memory modules, i.e. the DIMMs. Alternatively, the flexible bridges can be formed as a common part of some layers of adjacent memory modules.

In the embodiment shown in FIG. 1, a first pair of modules, DIMM 1–2, is connected via the flexible bridge 138 and a second pair of memory modules, DIMM 2–3, is connected via the flexible bridge 140. According to FIG. 1, all four slots are populated by memory modules and the memory chips of all modules can be connected by a data bus without bus stubs.

Figure 2:
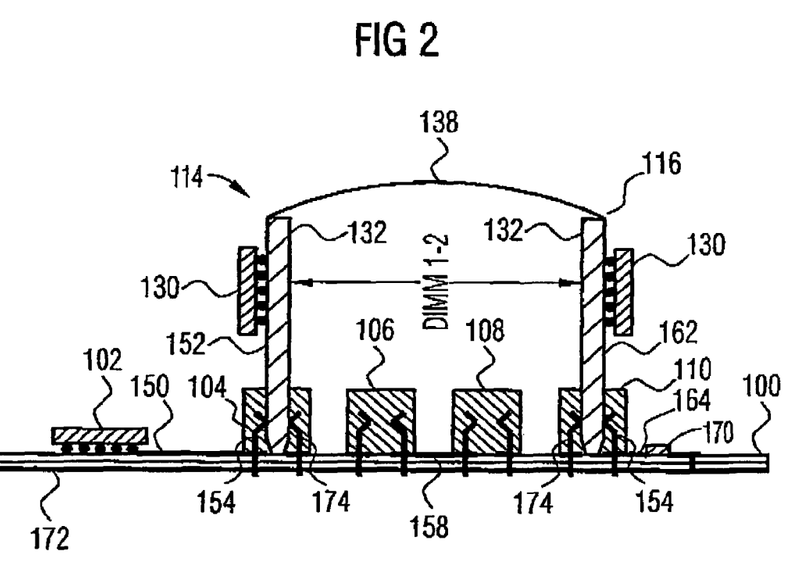
FIG. 2 shows a schematic side view of a further embodiment of an inventive memory system.

FIG. 2 shows the situation for the case that the memory system is populated by two memory modules 114 and 116 only. In this situation, the first memory module 114 is inserted into the first slot connector 104 and the second memory module 116 is inserted into the fourth slot connector 110. Again, the first and second memory modules are connected via the flexible bridge 138. Thus, for the two memory modules used, the data bus is formed by the portions 150, 152, 138, 162 and 164. Again, a continuous data bus without stub buses is achieved.

As can be derived from FIGS. 1 and 2, preferably the flexible bridges 138 and 140 are designed such that the respective pair of memory modules, DIMM 1–2 or DIMM 2–3, can be used according to FIG. 1 and according to FIG. 2. To this end, the flexible bridge and, thus, the signal lines thereof, have to be provided with a sufficient length.

The arrangement of a pair of memory modules connected via the flexible bridge can be sold as a separate package.

In FIGS. 1 and 2, a second row of electrical connectors 174 of the slot connectors 104, 106, 108 and 110 are connected to the reference potential plane 172, whereas the electrical connectors 154 are connected to respective data bus portions.

Figure 3:
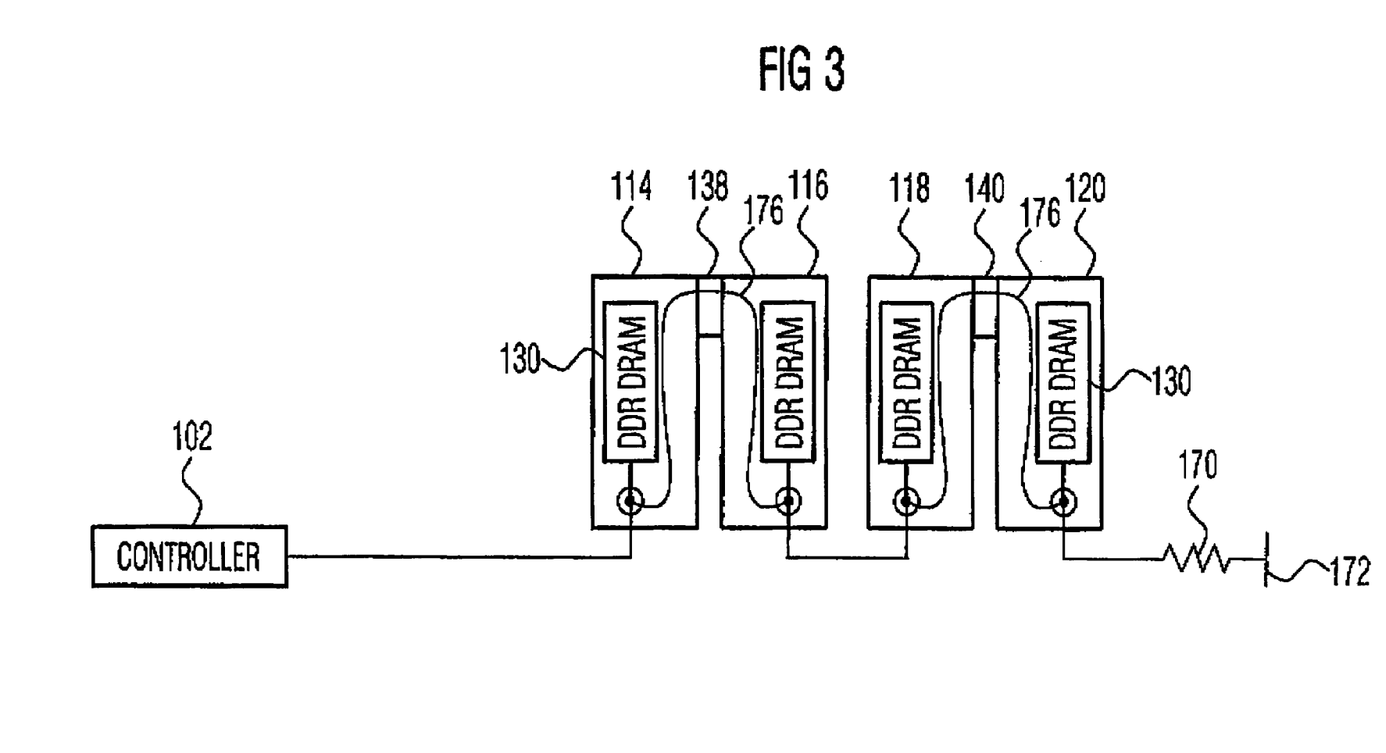
FIG. 3 shows a schematic view of a data bus topology achievable by the present invention.

In the embodiments described above with respect to FIGS. 1 and 2, the data bus between respective pairs of modules is implemented making use of a flexible bridge. The C/A bus topology and the clock bus topology can be realized as in existing systems. A schematic view of the data bus obtained in the embodiment of FIG. 1 is shown in FIG. 3 in which the data bus portion provided by the flexible bridges 138 and 140 are indicated as loop portions 176.

In alternative embodiments of the present invention flexible bridges between pairs of memory modules may be used for implementing C/A signal buses and/or clock buses rather than data buses or in addition to data buses.

Figure 4:
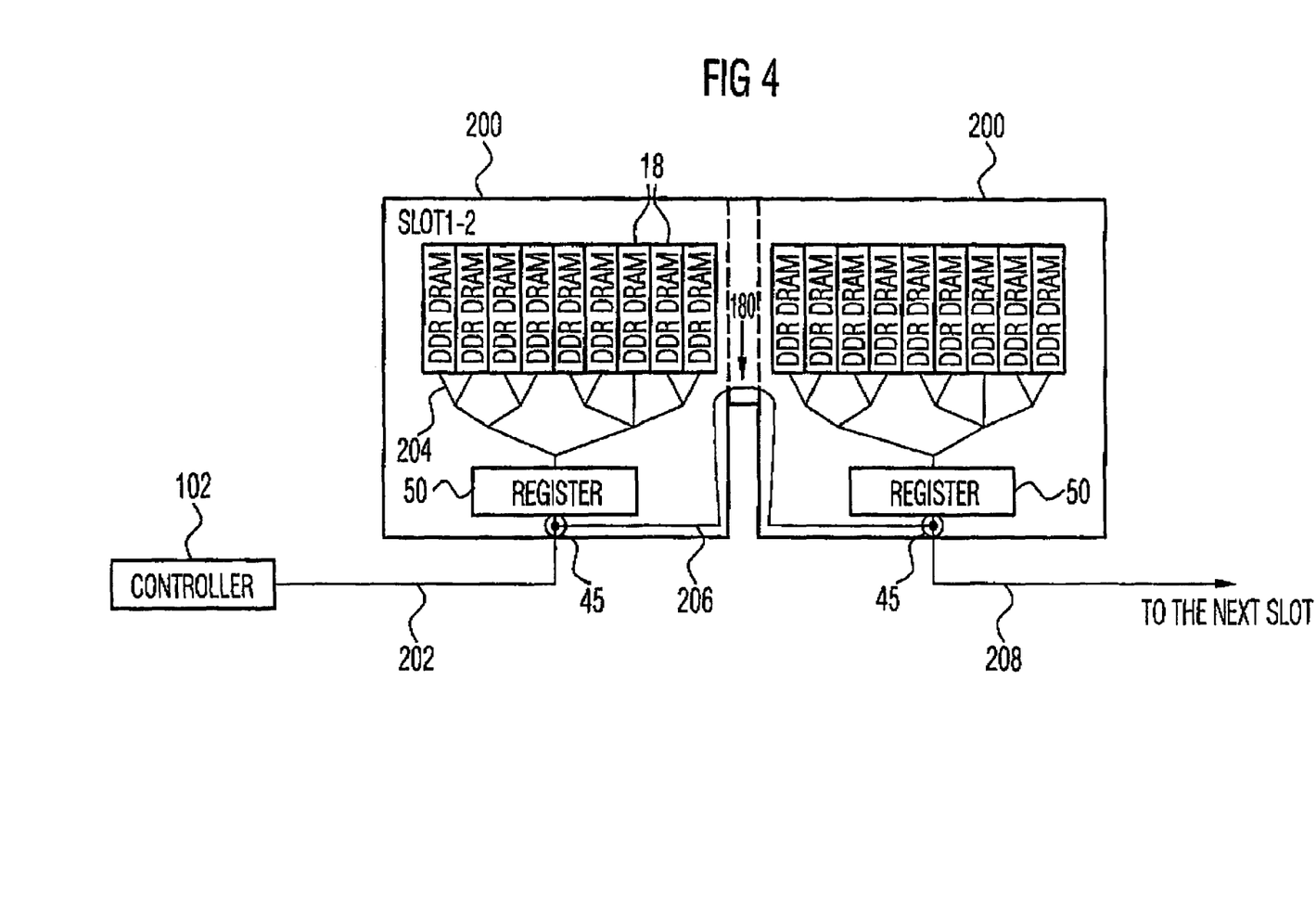
FIG. 4 shows a schematic view of C/A bus topology achievable by the present invention.

One embodiment of a registered C/A bus topology making use of a flexible bridge 180 is schematically shown in FIG. 4. FIG. 4 shows two memory modules 200 comparable to the memory modules 14 described above with respect to FIG. 13*b*, i.e. comprising respective registers 50 for providing a registered C/A bus. To this end, the register 50 of the left-hand module 200 is connected to a C/A bus portion 202 formed on the motherboard (not shown) via a slot connector 45. The output of the register 50 branches into a number of C/A subbuses 204 corresponding to the number of DDR DRAM chips 18 provided on the memory module. The C/A bus portion 206 between the memory modules shown in FIG. 4 is implemented making use of a flexible bridge 180 comprising signal lines to connect corresponding C/A bus lines on both memory modules to each other. Finally, the register 50 of the right-hand memory module shown in FIG. 4 is connected to the register of a memory module inserted into a next slot via a C/A bus portion provided on the motherboard (not shown).

Thus, a continuous C/A bus substantially without stub buses can be achieved comparable to the data bus explained above making reference to FIGS. 1 and 2. In FIG. 4, for sake of simplicity, only one C/A line is shown for the C/A bus portions, while, in reality, the C/A bus portions may include a number of 21 to 27 address lines, for example.

Figure 5:
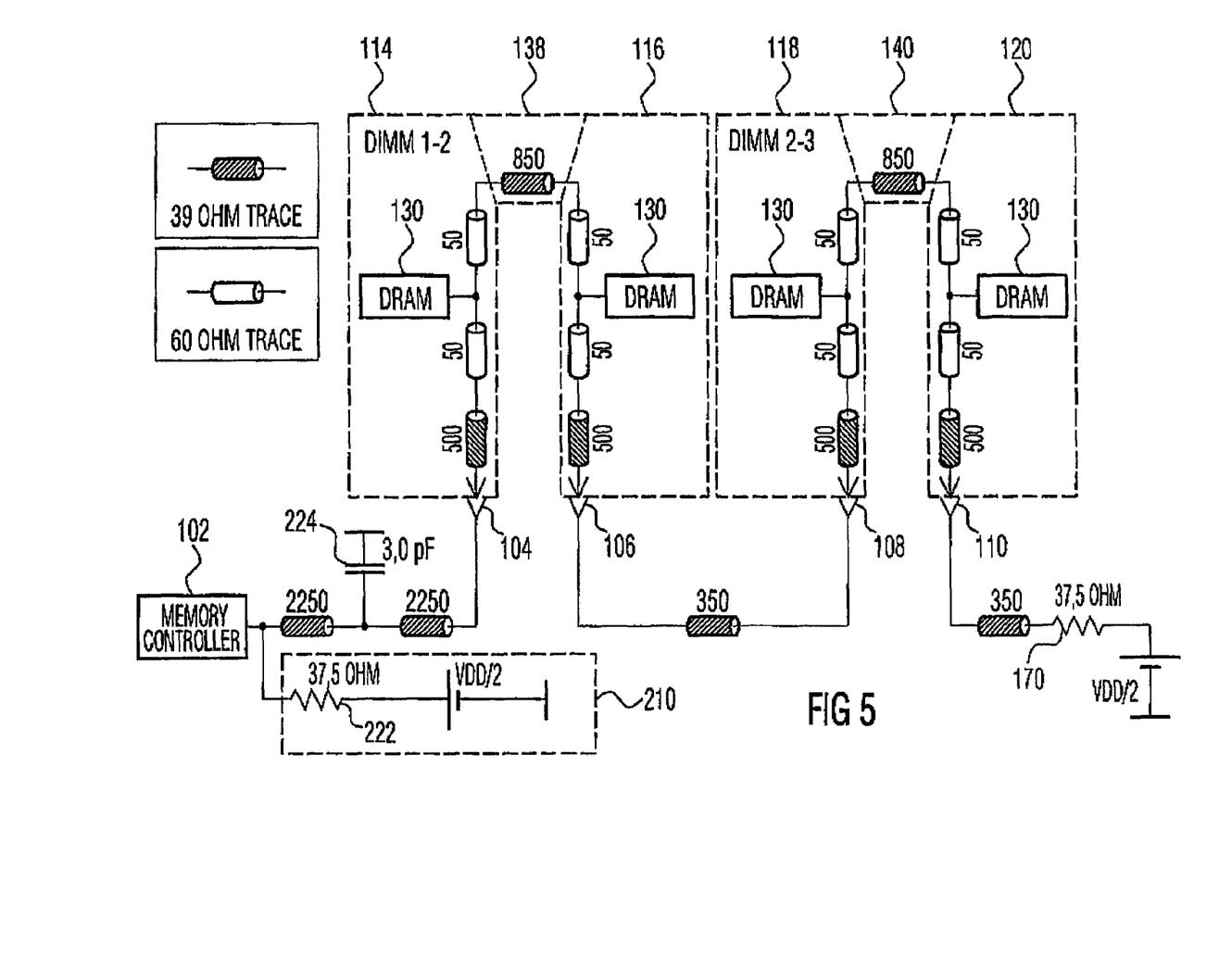
FIG. 5 a shows a diagram for further explaining the embodiment shown in FIG. 1.

A diagram showing a possible realization of the data bus in the embodiment shown in FIG. 1 is shown in FIG. 5. In FIG. 5 possible line lengths in mils are indicated by the numbers with which the respective line symbols are provided. 1 mil is equal to 25.4 μm, so that: 2250 mil=57 mm; 500 mil=12.7 mm; 50 mil=1.27 mm; 850 mil=21.6 mm; and 350 mil=8.9 mm.

The trace impedance of the respective line portions is indicated in the upper left-hand corner of FIG. 5 stating that the bright line portions have a trace impedance of 60 Ohm, whereas the darker line portions have a trace impedance of 39 Ohm. It can be derived from FIG. 5 that the trace impedance is aligned along the data bus, in the embodiment shown to 39 Ohm. The short cuts of 60 Ohm traces are used for compensation of reflections. Moreover, the termination resistor 170 is shown in FIG. 5 as having a resistance of 37.5 Ohm. Moreover, according to FIG. 5, the reference potential is VDD/2, wherein VDD represents a power supply voltage.

Further shown in FIG. 5 is a controller active termination 210 comprising a resistor 222 of, for example, 37.5 Ohm connected between the output of the memory controller 102 and a reference potential of, for example, VDD/2. The controller active termination 210 is active only during the read operation. The DRAM chips 130 send to the data bus voltage pulses which must be terminated on the ends of the bus, otherwise interpolation between reflected (from the none-terminated end) and incoming waves will distort a signal. Such reflection is prevented by the termination resistors 170 and 222. The controller active termination 210 is of a conventional structure and can be implemented by a termination resistor embedded into the chip and deactivated by a transistor switch (not shown) during write operation. In some existing products, such an active termination is also used in the DRAMs during write operation.

As can be seen in FIG. 5, a compensation capacitor 224 can be connected between the data bus portion on the motherboard and ground at the half of the length of that data bus portion, for example. The capacitance of the compensation capacitor may be 3.0 pF, for example. One of the objects of the compensation capacitor is to make the frequency characteristic of the whole system a little more linear. Moreover, EM waves reflected from this capacitor 224 compensate waves reflected from the controller 102.

Figure 6:
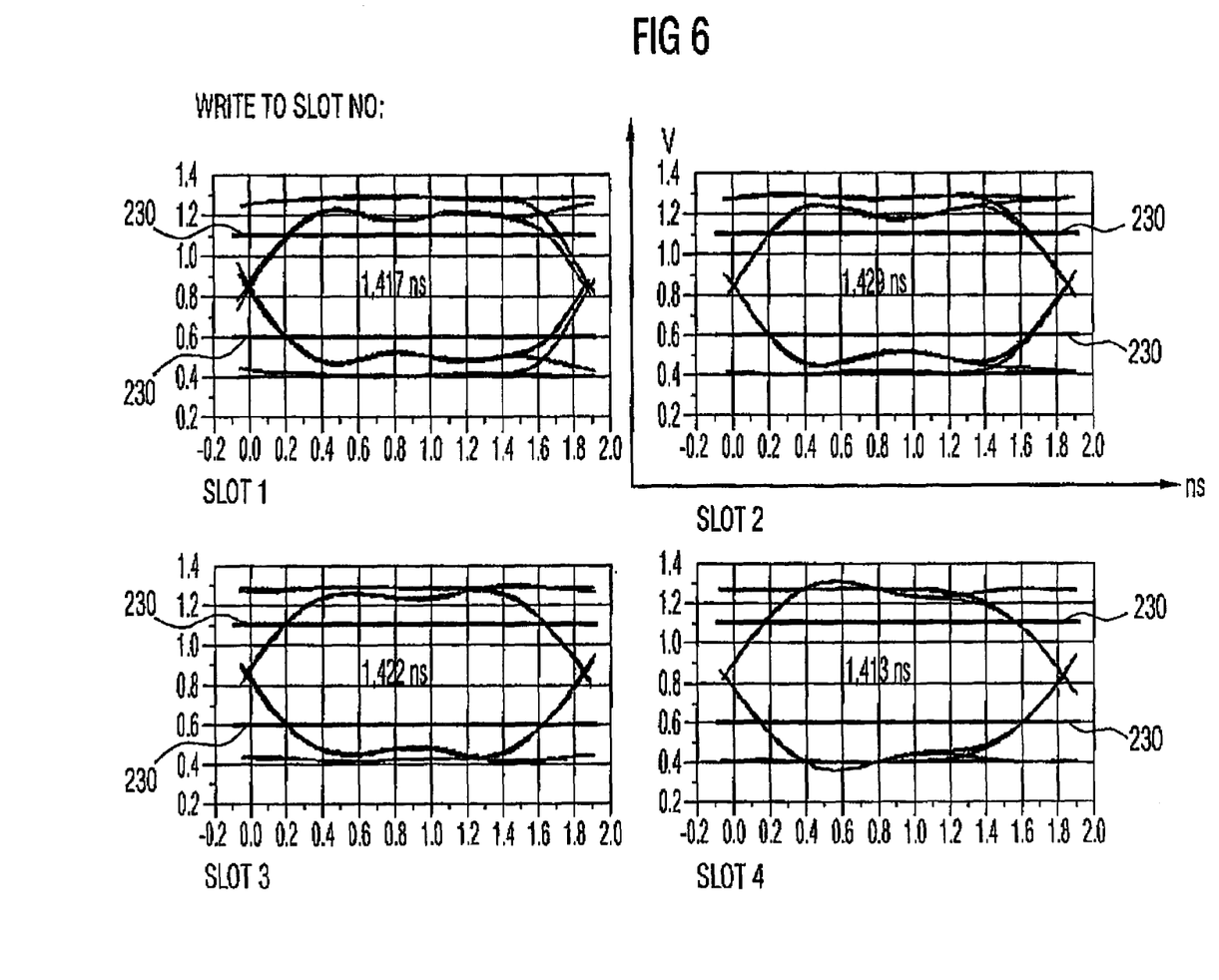
FIGS. 6 and 7 show representations of data signals obtained from the system shown in FIG. 5.
Figure 7:
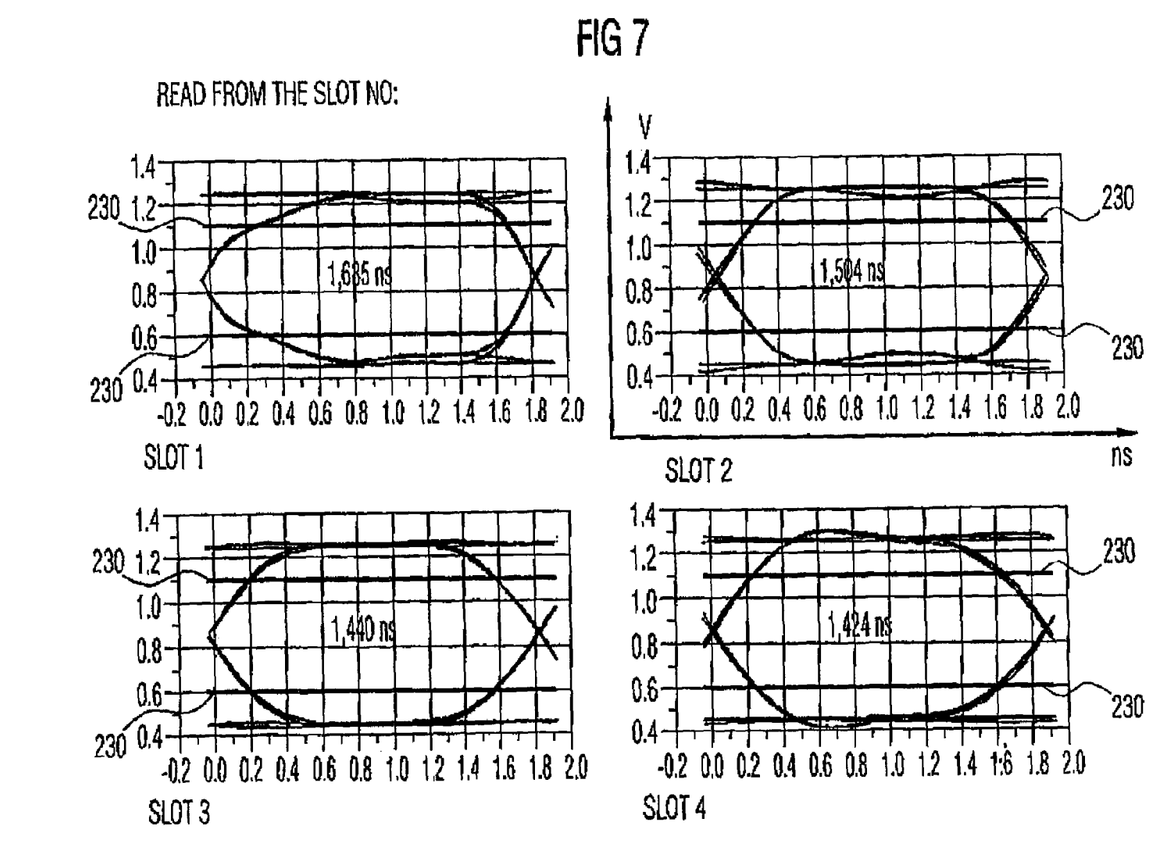

In FIGS. 6 and 7, data eyes for a write operation (FIG. 6) and a read operation (FIG. 7) for the system of FIGS. 1 and 5 being the result of a simulation are shown. The data eyes have been obtained when making use of the following parameters.

The used data rate was 533 Mb/s and the used bit sequence was a ISI 40 bit sequence. VDD was 1.7 V. The equivalent output resistance of the memory controller 102 was 35 Ohm. The equivalent output resistance of the DRAM chips 130 was 21 Ohm. The input capacitance of the memory controller 102 was 4 pF and the input inductance thereof was 3 nH. The input capacitance of the DRAM chips was 4 pF and the inductance thereof was 3 nH. The above parameter indicating the capacitances of the controller and the chips is mainly determined by parasitic capacitances of a pin and the capacitance connected to such a pin (caused by pin transistors on the chip and so on, for example). The inductances of the memory controller and the DRAM chips are mainly caused by the parasitic inductances of the chip packages.

The data eyes shown in FIGS. 5 and 6 were obtained when making use of a resistor driver model with a resistance of the resistors 127 and 222 of 37.5 Ohm and a rise/fall time of 0.25 ns.

Open data eyes were measured at levels VDD/2 +/−250 mV, wherein these levels are shown by respective lines 230 in FIGS. 6 and 7. Moreover, the duration of the respective open data eyes are indicated in FIGS. 6 and 7.

The data eyes shown in FIGS. 6 and 7 have been obtained by making use of a bridge length of 850 mil (about 21.6 mm) (see FIG. 5). However, further simulations showed that comparable results without any degradation of signal quality could be obtained making use of longer bridge lengths of 1200 mil (about 30.5 mm), for example.

Figure 8:
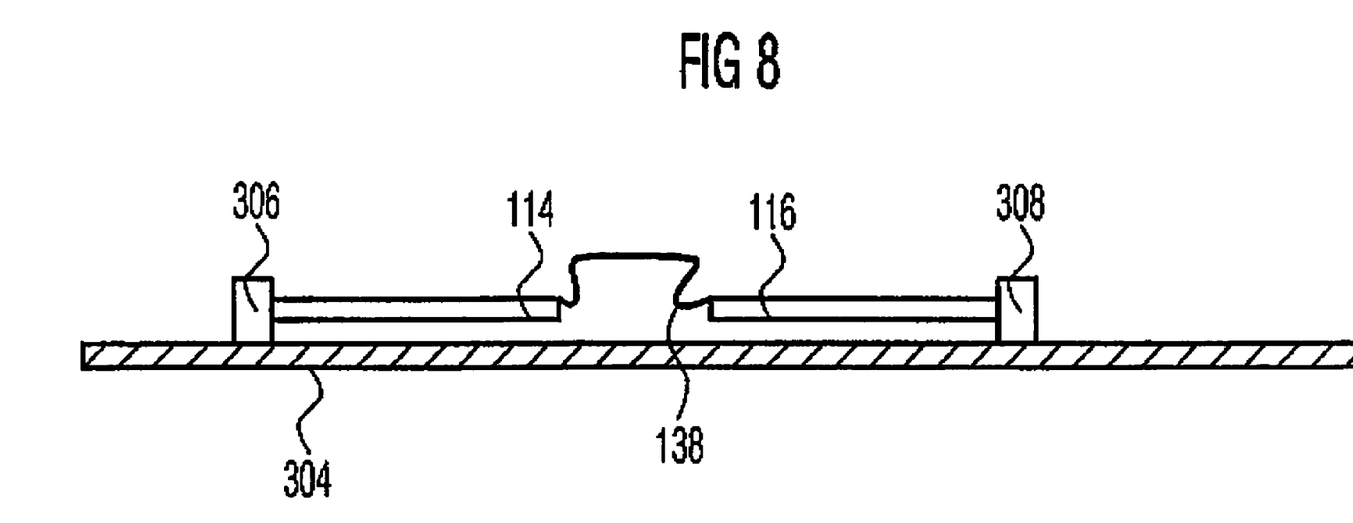
FIG. 8 an alternative embodiment of an inventive memory system.

In FIG. 8 an alternative configuration of an inventive memory system is shown, wherein the memory modules 114 and 116 are arranged parallel with respect to a motherboard 304. The memory module 114 is connected to the motherboard 304 via a first connector 306 and the memory module 116 is connected to the motherboard 304 via a second connector 308. Again, the modules 114 and 116 are connected the flexible bridge 138 to provide a continuous data bus without making use of stubs. Such a configuration is appropriate for laptops, for example. The memory subsystem comprising both memory modules and the flexible bridge shown in FIG. 8 may be identical to that described with respect to FIG. 1.

Figure 9:
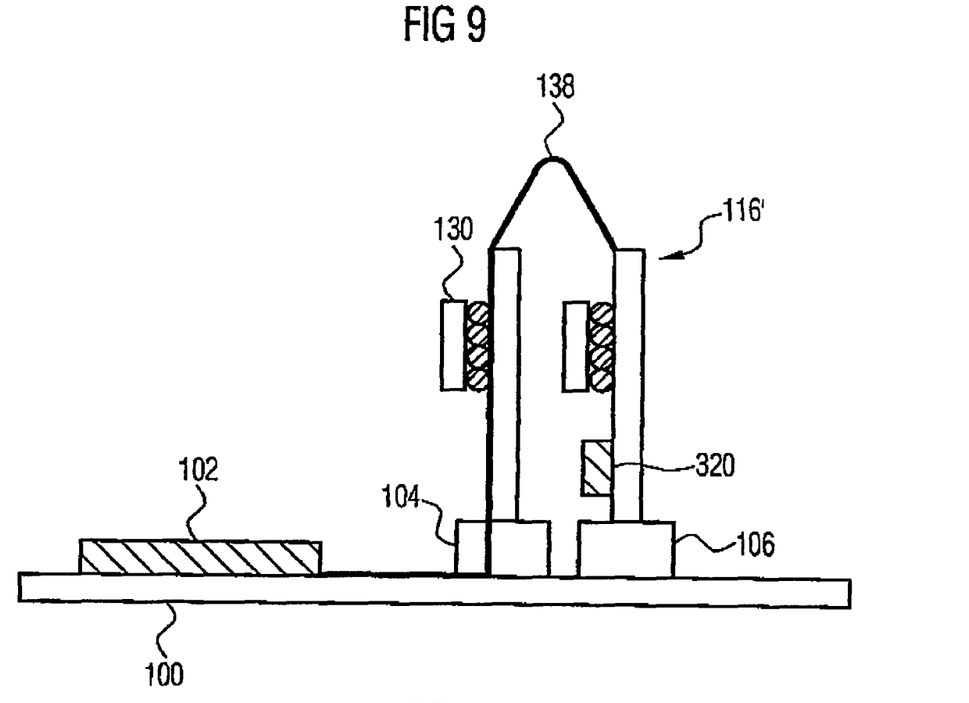
FIG. 9 a modification of the embodiment of the invention shown in FIG. 1.

FIG. 9 shows a modification of the embodiment of the invention shown in FIG. 1. According to FIG. 9, a termination resistor 320 is arranged on a memory module 116'. Thus, the terminator is arranged directly on the memory subsystem, i.e. the "double module" having a flexible bridge. In such a case, a termination on the motherboard is no longer necessary. Thus, it would be possible to populate two adjacent slots of a motherboard having four slots only (the motherboard of FIG. 1, for example, with or without the termination resistor 170) while still obtaining an appropriate termination of the data bus. Alternatively, the motherboard could include two slots only.

Figure 10:
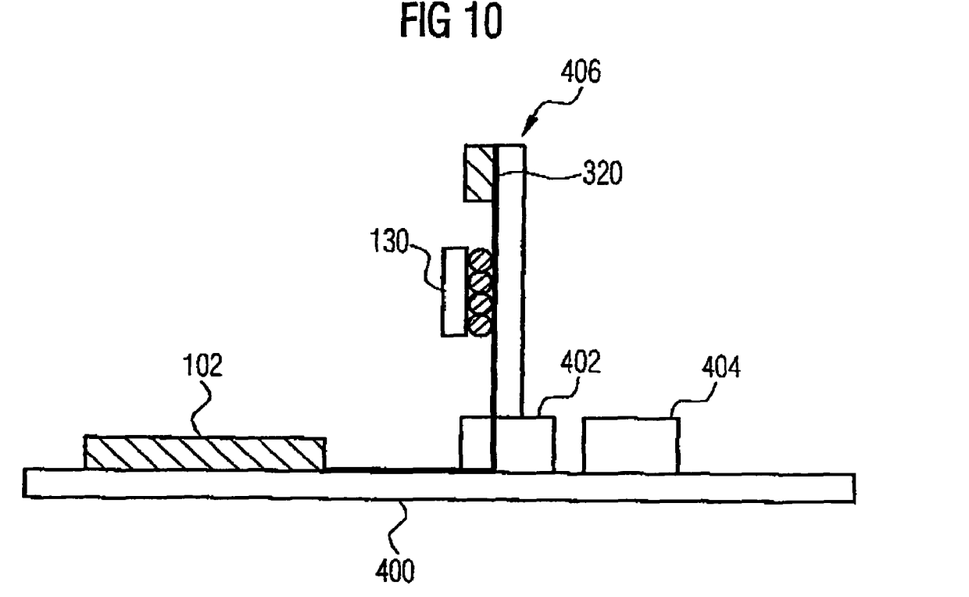
FIG. 10 a memory system providing a reduced capacity.

A motherboard 400 having two slots 402 and 404 of which only slot 404 is populated with a memory module 406 is shown in FIG. 10. The memory module 406 has arranged thereon a termination resistor 320 so that a complete data bus is obtained even in case only the slot 402 is populated.

Systems having only one or two memory modules may be considered for applications in which a reduced amount of memory is needed, non-server PC systems, for example.

In the above specification, the reference potential plane can be formed by a ground plane in single ended systems and can be formed by a predetermined potential of VDD/2, for example, in differential systems.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A memory system comprising:
   a circuit board having a first means for receiving and a second means for receiving;
   a first signal bus portion on said circuit board connected to said first means for receiving; and
   a second signal bus portion on said circuit board connected to said second means for receiving and not connected to said first signal bus portion,
   a first memory module received in said first means for receiving;
   a second memory module received in said second means for receiving; and
   a flexible bridge connecting said first and second memory modules for providing a signal bus between said memory modules, so that said first and second memory modules are serially connected between said first and second signal bus portions on said circuit board.

2. The memory system of claim 1, wherein the memory modules are received in the respective means for receiving at a first side thereof and wherein the flexible bridge extends from a respective second side of the memory modules.

3. The memory system of claim 1, wherein the respective second side of the memory module is arranged opposite to the first side thereof.

4. The memory system of claim 1, wherein the receiving means are slot connectors for receiving memory modules adapted for DDR memory systems.

5. The memory system of claim 1, wherein the flexible bridge comprises data lines and/or control signal lines for providing a data bus and/or a control signal bus between said memory modules.

6. The memory system of claim 1, wherein a memory controller is provided on said circuit board and connected to said first signal bus portion, wherein said first signal bus portion provides a data bus and/or a control signal bus between said controller and said first memory module.

7. The memory system of claim 6, wherein said first signal bus portion further provides a clock bus between said memory controller and said first memory modules.

8. The memory system of claim 1, further comprising third means for receiving on said circuit board and wherein said second signal bus portion connects said second means for receiving to said third means for receiving.

9. The memory system of claim 1, wherein the bridge is a flexible printed circuit board having a ground layer and a signal layer.

10. The memory system of claim 1, wherein said signal bus provided by said flexible bridge has a trace impedance matched to a trace impedance of said bus portions on the circuit board and matched to a trace impedance of bus portions on said memory modules.

11. The memory system of claim 1, wherein the circuit board comprises four means for receiving and wherein the flexible bridge has a length permitting the first and second means for receiving to be separated by two other means for receiving.

12. The memory system of claim 1 wherein said first and second receiving means are first and second slot connectors each for receiving a single memory module.

13. A memory system comprising:
a circuit board having a first slot connector for receiving a single memory module and a second slot connector for receiving a single memory module;
a first signal bus portion on said circuit board connected to said first slot connector;
a second signal bus portion on said circuit board having a first end connected to said second slot connector and not connected to said first signal bus portion;
a first memory module mounted in said first slot connector;
a second memory module mounted in said second slot connector; and
a flexible bridge connecting said first and second memory modules for providing a signal bus between said memory modules so that said first and second memory modules are serially connected between said first and second signal bus portions on said circuit board.

14. The memory system of claim 13, wherein the memory modules are received in the respective slot connectors at a first side thereof and wherein the flexible bridge extends from a second side of the memory modules.

15. The memory system of claim 13, wherein the flexible bridge comprises data lines and/or control signal lines for providing a data bus and/or a control signal bus between said memory modules.

16. The memory system of claim 13 further comprising a third slot connector and a fourth slot connector.

17. The memory system of claim 16 wherein said third and fourth slot connectors are located between said first and second slot connector.

18. The memory system of claim 16, wherein the other end of said second signal bus portion is connected to said third slot connector and further comprising a third signal bus portion on said circuit board connected to said fourth slot connector;
a third memory module mounted in said third slot connector;
a fourth memory module mounted in said fourth slot connector;
another flexible bridge connecting said third and fourth memory modules to provide a signal bus between said third and fourth memory modules so that said third and fourth memory modular are serially connected between said second and third signal bus portions and so that said first, second, third, and fourth memory modules are serially connected between said first and third bus portions.

19. A memory system comprising:
a circuit board comprising a first slot connector and a second slot connector, each of said first and second slot connectors capable of receiving only a single memory module;
a first memory module mounted in said first slot connector;
a second memory module mounted in said second slot connector; and
a flexible bridge connecting said first and second memory module for providing a signal bus between said memory modules so that said first and second memory modules are serially connected between said first and second signal bus portions on said circuit board.

* * * * *